United States Patent
Ray

(10) Patent No.: US 8,456,957 B2
(45) Date of Patent: *Jun. 4, 2013

(54) ULTRASONIC TRANSDUCER FOR A PROXIMITY SENSOR

(75) Inventor: Rand Kalani Ray, Dayton, OH (US)

(73) Assignee: Schneider Electric USA, Inc., Palatine, IL (US)

( * ) Notice: Subject to any disclaimer, the term of this patent is extended or adjusted under 35 U.S.C. 154(b) by 458 days.

This patent is subject to a terminal disclaimer.

(21) Appl. No.: 12/858,665

(22) Filed: Aug. 18, 2010

(65) Prior Publication Data

US 2010/0309018 A1    Dec. 9, 2010

Related U.S. Application Data

(63) Continuation-in-part of application No. 12/021,470, filed on Jan. 29, 2008, now Pat. No. 7,804,742.

(51) Int. Cl.
*G01C 3/08* (2006.01)
*H01L 41/187* (2006.01)

(52) U.S. Cl.
USPC ............................................ 367/140

(58) Field of Classification Search
USPC ................. 367/140, 152; 310/334
See application file for complete search history.

(56) References Cited

U.S. PATENT DOCUMENTS

| | | |
|---|---|---|
| 3,997,804 A | 12/1976 | Tamura et al. |
| 4,310,730 A | 1/1982 | Aaroe |
| 4,461,177 A | 7/1984 | Feng |
| 4,479,069 A | 10/1984 | Miller |
| 4,494,033 A | 1/1985 | Morse et al. |
| 4,771,205 A | 9/1988 | Mequio |
| 5,729,185 A | 3/1998 | Johnson et al. |
| 5,917,776 A | 6/1999 | Foreman |
| 6,060,780 A | 5/2000 | Ohta et al. |
| 6,165,144 A | 12/2000 | Talish et al. |
| 6,178,252 B1 | 1/2001 | Frasl et al. |
| 6,198,207 B1 | 3/2001 | Lally et al. |
| 6,225,728 B1 | 5/2001 | Gururaja |
| 6,278,790 B1 | 8/2001 | Davis et al. |
| 6,318,624 B1 | 11/2001 | Pattanaik et al. |
| 6,378,376 B1 | 4/2002 | Derman et al. |
| 6,497,667 B1 | 12/2002 | Miller et al. |
| 6,550,664 B2 | 4/2003 | Bradley et al. |
| 6,577,743 B2 | 6/2003 | Masuda et al. |
| 6,995,501 B2 | 2/2006 | Fukuda et al. |
| 6,996,883 B2 | 2/2006 | Chandran et al. |
| 7,016,655 B2 | 3/2006 | Vakilian |
| 7,087,970 B2 | 8/2006 | Nakamura |
| 7,143,487 B2 | 12/2006 | Kikuchi et al. |
| 7,180,228 B2 | 2/2007 | Masuko et al. |
| 7,187,108 B2 | 3/2007 | Hasegawa et al. |
| 7,804,742 B2 * | 9/2010 | Ray et al. ............... 367/140 |
| 2007/0063616 A1 | 3/2007 | Adachi et al. |
| 2009/0189488 A1 | 7/2009 | Ray et al. |
| 2010/0309018 A1 * | 12/2010 | Ray ............... 340/825.49 |

* cited by examiner

Primary Examiner — Daniel Pihulic
(74) Attorney, Agent, or Firm — Stevens & Showalter LLP

(57) ABSTRACT

An ultrasonic transducer assembly for use in sensing the location of objects in proximity to the transducer. The ultrasonic transducer assembly includes a piezoceramic resonator plate and a coupler. The resonator plate is supported to the coupler in cantilever relation. The coupler extends transverse to the resonator plate for acoustically coupling the resonator plate to a medium in contact with the coupler.

16 Claims, 4 Drawing Sheets

ULTRASONIC TRANSDUCER FOR A PROXIMITY SENSOR

CROSS-REFERENCE TO RELATED APPLICATION

This application is A CONTINUATION-IN-PART APPLICATION of and claims priority to U.S. patent application Ser. No. 12/021,470, filed on Jan. 29, 2008, entitled "ULTRASONIC TRANSDUCER FOR A PROXIMITY SENSOR," the entire disclosure of which is incorporated by reference herein.

FIELD OF THE INVENTION

The present invention relates generally to ultrasonic transducers and, more particularly, to an ultrasonic transducer assembly that may be incorporated in a sensor to detect the presence and/or range of objects.

BACKGROUND OF THE INVENTION

Ultrasonic sensing systems provide an efficient and effective method of detecting objects, such as may be utilized in automated industrial manufacturing processes. These sensors require the use of a transducer to produce ultrasonic signals. For example, a transducer for such sensors typically generates an ultrasonic signal that is transmitted in the direction of an object, and a return or reflected signal is received by the transducer. A processor connected to the transducer processes the received signal and determines the presence and/or distance to an object based on the elapsed time between the transmitted and received signals.

Prior art piezoceramic ultrasonic transducers, such as those for use in air-based time-of-flight applications, have generally been designed to have very good long range detection capabilities. In designing these sensors, it has typically been considered desirable to maximize the Q value, i.e., the resonance, of the transducer and minimize the frequency of operation. A high Q value results in greater amplification of a returning signal, and low frequency serves to reduce the attenuation of ultrasound in air because attenuation is a function of frequency. Such prior art transducers have typically been configured as thin disks formed of ceramic material, which traditionally exhibit the benefit of a high Q value.

For various reasons, there are limitations on improving the efficiency and reducing the cost of manufacturing circular shaped ceramic disks, which in turn limits available cost reductions for components incorporating the ceramic disks, such as transducers incorporated into sensors. Accordingly, it is desirable to provide an alternative configuration for a sensor transducer that may incorporate a resonator component having a form factor or shape conducive to efficient production of both the resonator component and the assembled transducer.

SUMMARY OF THE INVENTION

In accordance with one aspect of the invention, an ultrasonic transducer assembly is provided for use in sensing the location of objects in proximity to the transducer. The ultrasonic transducer assembly comprises a piezoceramic resonator plate comprising an elongated member including a major dimension and a minor dimension. The transducer assembly further includes a coupler connected to a surface of the resonator plate for acoustically coupling the resonator plate to a medium in contact with the coupler. The coupler comprises a substantially rigid plate-like diaphragm member extending transverse to the resonator plate.

In accordance with another aspect of the invention, an ultrasonic transducer assembly is provided for use in sensing the location of objects in proximity to the transducer. The ultrasonic transducer assembly comprises a piezoceramic resonator plate including opposing planar surfaces. Electrical contacts are connected to each of the planar surfaces of the resonator plate for connecting the resonator plate to a power supply. The transducer assembly further includes a coupler comprising opposing first and second sides, the first side extending transverse to and connected to a surface of the resonator plate for acoustically coupling the resonator plate to a medium in contact with the second side of the coupler.

In accordance with a further aspect of the invention, a sensor is provided including an ultrasonic transducer assembly for use in sensing the location of objects in proximity to the transducer. The sensor comprises a rectangular piezoceramic resonator plate defining an elongated major dimension and a minor dimension. The resonator plate includes opposing planar surfaces. Electrical contacts are connected to each of the planar surfaces for connecting the resonator plate to a power supply. The sensor further includes a disk-shaped coupler comprising a planar member including opposing first and second sides. The first side extends transverse to and connects to a surface of the resonator plate, wherein the resonator plate is supported in cantilever relation on the coupler with an end of its major dimension extending from the first side of the coupler. The coupler is acoustically excited by the resonator plate to transmit a signal to an object in proximity to the coupler, and the coupler receives and transmits reflected signals from the object to the resonator plate.

BRIEF DESCRIPTION OF THE DRAWINGS

While the specification concludes with claims particularly pointing out and distinctly claiming the present invention, it is believed that the present invention will be better understood from the following description in conjunction with the accompanying Drawing Figures, in which like reference numerals identify like elements, and wherein:

DETAILED DESCRIPTION OF THE INVENTION

In the following detailed description of the preferred embodiment, reference is made to the accompanying drawings that form a part hereof, and in which is shown by way of illustration, and not by way of limitation, a specific preferred embodiment in which the invention may be practiced. It is to be understood that other embodiments may be utilized and that changes may be made without departing from the spirit and scope of the present invention.

Figure 1:
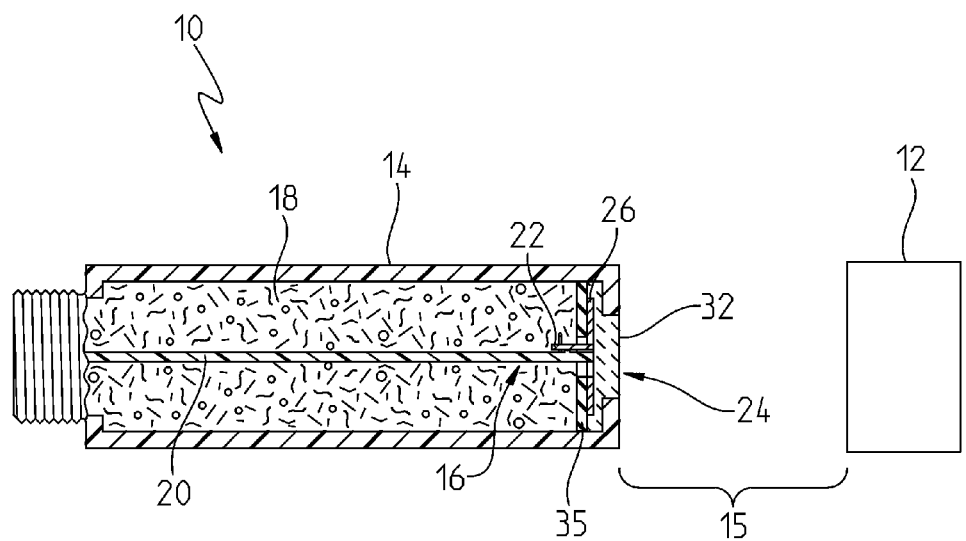
FIG. 1 is a side elevation view in partial cross-section of a sensor system incorporating a transducer assembly in accordance with the present invention.

Referring to FIG. 1, there is shown an ultrasonic sensor 10 for determining the presence and distance of an object 12 in proximity to the sensor 10. The sensor comprises a housing 14 and a transducer assembly 16, and including a damping material 18 surrounding the transducer assembly 16 within the housing 14, as will be described further below.

Figure 2:
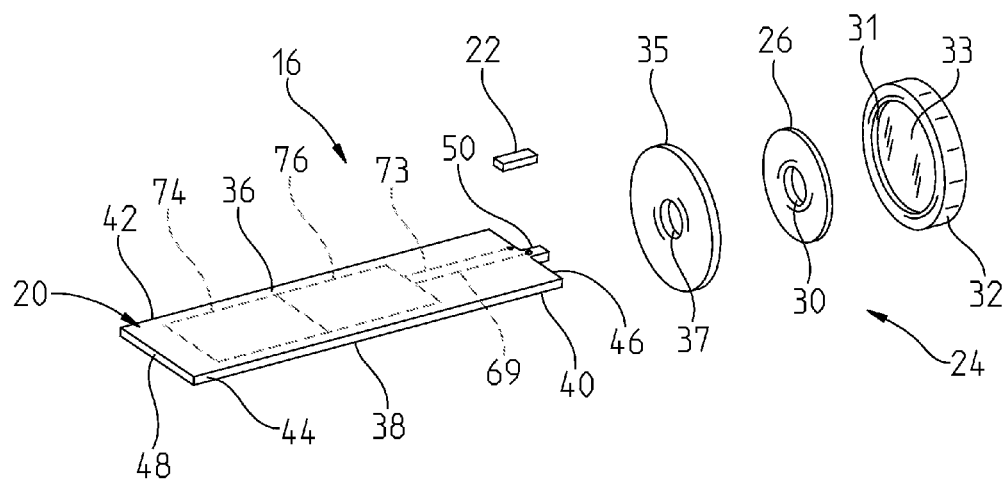
FIG. 2 is an exploded perspective view of the transducer assembly in accordance with the present invention.

Referring to FIG. 2, the transducer assembly 16 includes a substrate member 20 defined by a printed circuit board, a transducer or resonator plate 22, and a plate-like coupler or coupling assembly 24 connected to and extending transversely to the resonator plate 22. The coupling assembly 24 provides an ultrasonic interface between the relatively small resonator plate 22 and a medium, such as air, filling the space between the sensor 10 and the object 12, as depicted by the region 15 in FIG. 1.

The resonator plate 22 may be constructed from any suitable piezoelectric material. In a preferred embodiment, the resonator plate 22 comprises a piezoceramic plate. In particular, the resonator plate 22 may be constructed from a lead zirconate titanate, such as PZT5A which may be obtained from, for example, Morgan Electro Ceramics, Bedford, Ohio. Desirable characteristics associated with a piezoceramic material for the present application include high mechanical-to-electrical conversion efficiency, a substantially flat temperature response, and a relatively high mechanical quality factor (Qm) which in the present example is approximately 75.

Figure 3:
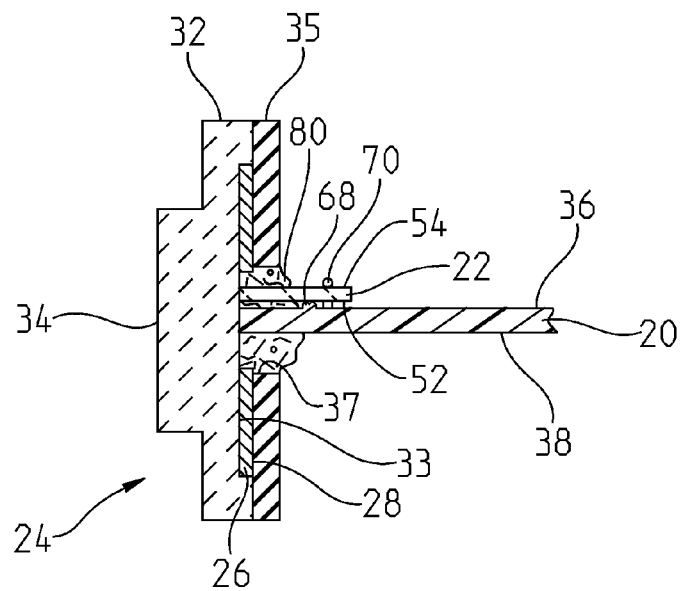
FIG. 3 is an enlarged cross-section view of the coupler end of the transducer assembly in accordance with the present invention.

Referring further to FIG. 3, the coupling assembly 24 comprises a substantial surface area for transferring ultrasonic energy from the resonator plate 22 to the medium. In the illustrated embodiment, the coupling assembly 24 comprises a diaphragm 26 defining a first side 28 of the coupling assembly 24. The diaphragm 26 is capable of vibrating in response to vibratory energy from the resonator plate 22. The diaphragm 26 comprises a stiff or rigid material and may be formed of a variety of materials including, without limitation, metal, plastic, or a polymer, e.g., a molded thermoset polymer such as an epoxy. In one preferred embodiment, the diaphragm 26 may be formed of a thin plate of stainless steel. As illustrated herein, the diaphragm 26 of the present embodiment is a thin or plate-like, disk-shaped member where the vibratory energy from the resonator plate 22 is substantially distributed in a direction that is orthogonal to said substrate member 20. That is, the acoustic vibratory signals travel along a path directed circumferentially and radially from a central location on the diaphragm 26, defined at an aperture 30 in the diaphragm 26, to an outer edge of the diaphragm 26. It should be understood that the diaphragm 26 is not limited to a disk-shaped member and may comprise a plate-like member embodying other shapes.

The coupling assembly 24 may further include an impedance matching member 32, illustrated herein as a disk-shaped member located over the diaphragm 26. The impedance matching member 32 defines a second, outwardly facing side 34 of the coupling assembly 24. The impedance matching member 32 comprises a material selected to maximize coupling of the ultrasonic energy from the resonator plate 22 to the medium 15, and is typically a different material than the material of the diaphragm 26. For example, the impedance matching member 32 may comprise a relatively resilient material such as rubber, an epoxy material, a polymer, glasses, or combinations and/or mixtures of these materials. In a preferred embodiment for interfacing with an air medium, the impedance matching member 32 comprises a glass-filled epoxy member. It should be understood that although air is referenced as a medium for the purposes of describing the present embodiment, the material and construction of the impedance matching member 32 may be selected such that the impedance matching member 32 is configured to couple to other media including liquids or other gases. In addition, the impedance matching member 32 is not limited to the illustrated disk-shaped configuration and may comprise other shapes such as, for example, a shape matching the shape of the diaphragm 26.

As seen in FIGS. 2 and 3, the impedance matching member 32 includes a recess area 31 for receiving the diaphragm 26. The surface of the diaphragm 26 opposite the first side 28 is positioned in engagement with a surface 33 of the impedance matching member 32 with the recess 31 for transmittal of ultrasonic signals between the diaphragm 26 and the impedance matching member 32.

It should further be understood that in some applications of the sensor 10 described herein, it may be possible to construct the coupling assembly 24 without an impedance matching member 32. For example, the coupling assembly 24 may be constructed with the material of the diaphragm 26 selected to provide a satisfactory coupling to effectively deliver and receive ultrasonic energy to and from the medium.

An isolation member 35 is located adjacent to the first side 28 of the coupling assembly 24, i.e., behind the impedance matching member 32 and the diaphragm 26. The isolation member 35 is preferably formed of a resilient material and provides an isolation layer or barrier for isolating at least the diaphragm 26, and preferably both the diaphragm 26 and impedance matching member 32, from the damping material 18 within the housing 14. In a preferred embodiment, the damping material 18 comprises a urethane material and the isolation member 35 comprises a silicon rubber material, i.e., a silicon foam rubber, and has a circular configuration with a central aperture 37. The isolation member 35 preferably has an outer diameter that substantially matches the diameter of the coupling assembly 24.

As seen in FIG. 2, the substrate member 20 is configured as an elongated rectangular element comprising an upper planar surface 36, a lower planar surface 38, and a peripheral edge 40 defined by opposing generally parallel side edges 42, 44 and by opposing generally parallel front and rear edges 46, 48, respectively. A tongue or peninsula portion 50 extends in cantilever relation from the front edge 46 centrally between the side edges 42, 44.

Figure 4:
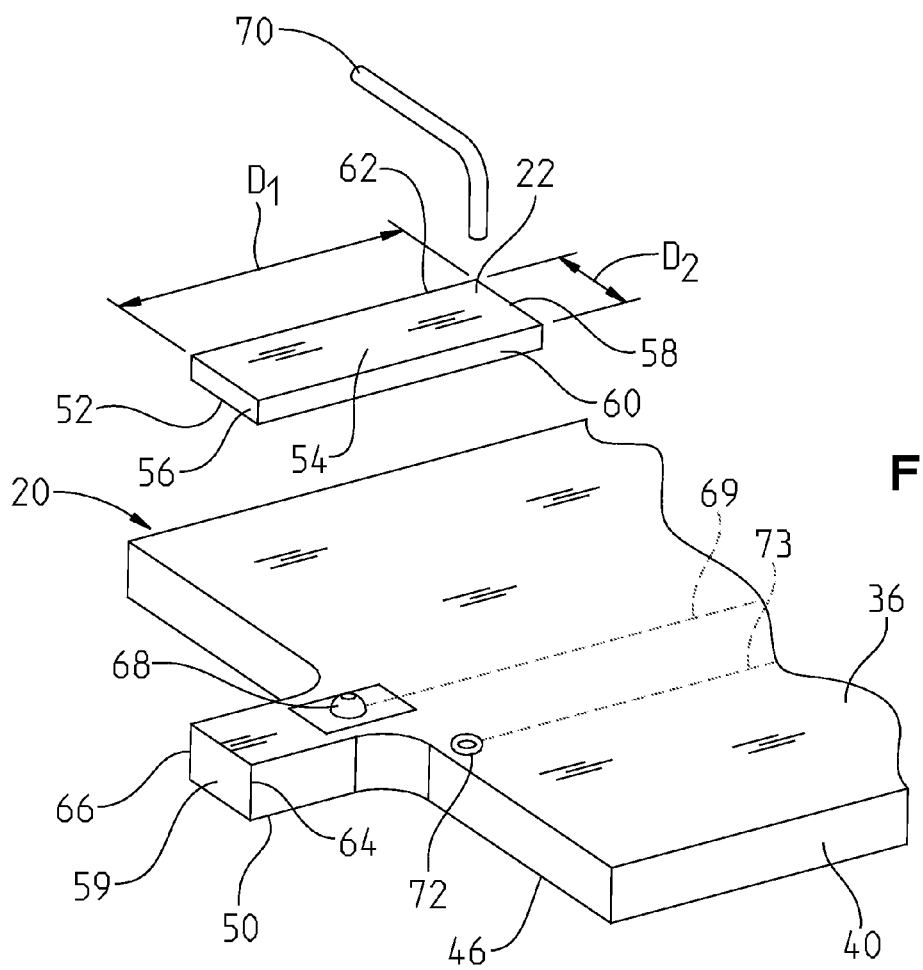
FIG. 4 is an exploded perspective view showing assembly of a resonator plate to a printed circuit board substrate for the transducer assembly in accordance with the present invention

Referring further to FIG. 4, the resonator plate 22 is shown as comprising an elongated plate-like element having a substantially planar inner surface 52, a substantially planar outer surface 54, a front edge 56, a rear edge 58, and opposing side edges 60, 62. A major dimension $D_1$ is defined between the front and rear edges 56, 58, and a minor dimension $D_2$ is defined between the opposing side edges 60, 62. The resonator plate 22 is positioned with its inner surface 52 located on or adjacent to the upper surface 36 of the substrate member 20, and with its major dimension $D_1$ extending from the front edge 46 of the substrate member 20 over the peninsula portion 50. The front edge 56 of the resonator plate 22 is located adjacent a front edge 59 of the peninsula portion 50. The minor dimension $D_2$ of the resonator plate 22 is substantially equal to a width of the peninsula portion 50, as measured between opposing sides 64 and 66 of the peninsula portion 50.

The resonator plate 22 is oriented parallel to the substrate member 20 and is preferably positioned on a first contact pad 68 located on the substrate member 20 to form an electrical contact between the inner surface 52 and the first contact pad 68. The contact pad 68 preferably comprises a raised portion that extends above the substrate member 20 for supporting the resonator plate 22 in cantilever relation, spaced from the substrate member 20. Hence, there is preferably an air gap between the inner surface 52 of the resonator plate 22 and the upper surface 36 of the substrate member 20. In addition, a top wire 70 is provided extending between the outer surface 54 and a second contact pad 72 on the substrate member 20. The first and second contact pads 68, 72 comprise conductors electrically connected to a power supply 74 and processor 76 (see FIG. 2) on the substrate member 20. The electrical connections from the contact pads 68, 72 may be formed by respective electrical strip lines 69, 73 etched on the printed circuit board defining the substrate member 20, see FIGS. 2 and 4. It should be understood that either or both the power supply 74 and processor 76 may be defined by a printed circuit board structure on the substrate member 20 in a conventional manner or, alternatively, may be located remotely from the substrate member 20.

Although the preferred embodiment comprises a single support, i.e., the first contact pad 68, for supporting the resonator plate 22, the resonator plate 22 may be supported by one or more additional supports. For example, the resonator plate 22 may be supported on a pair of supports located adjacent longitudinal ends of the resonator plate 22, where at least one of the supports preferably forms an electrical contact to the electrical strip line 69.

In a process for assembling the transducer assembly 16, the resonator plate 22 may be assembled to the substrate member 20 by an apparatus performing a pick-and-place operation to locate the resonator plate 22 on the peninsula portion 50 and extending over the first contact pad 68. The top wire 70 may be assembled to the substrate member 20 in an automated operation, such as an operation performed by feeding a plurality of prepared top wires 70 in a conventional tape and reel supply configuration. Each successive top wire 70 may be placed with a vertical portion thereof in engagement with the second contact pad 72, and with a horizontal portion of the top wire 70 engaged over the upper surface of the resonator plate 22 to form an electrical contact between the outer surface 54 and the electrical conductor 73 of the printed circuit board via the second contact pad 72, see FIG. 4. In the illustrated embodiment, a hole is shown in the second contact pad 72 for receiving the vertical portion of the top wire 70, however, such a hole is not required for implementation of the present invention.

The assembly of the resonator plate 22 to the substrate member 20 may be performed in an assembly method that includes placement of other components on the substrate member 20. Specifically, the resonator plate 22 and top wire 70 may be placed on the printed circuit board defining the substrate member 20, along with other components including those forming the processor 76 and power supply 74, and subjected to a conventional surface mount technology (SMT) reflow process to connect the components to the printed circuit board. Hence, one side of the resonator plate 22 is directly attached to the printed circuit board of the substrate member 20 through the SMT reflow process. Further, the SMT reflow attachment of the resonator plate 22 provides a high integrity attachment that generally requires fewer parts and reduced labor, as compared to known assemblies and processes typically implemented for attachment of prior art piezoceramic ultrasound components to circuit boards or similar mounting structures.

Subsequent to mounting the resonator plate 22 to the substrate member 20, the coupling assembly 24 is attached to at least the outer surface 54 of the resonator plate 22 adjacent to the front edge 56, and extending in orthogonal relation to the plane of the resonator plate 22. Specifically, the central aperture 30 in the diaphragm 26 is positioned over the end of the resonator plate 22, and the front edge 56 of the resonator plate 22 is positioned in engagement with or closely adjacent to an inner face 33 of the impedance matching member 32. In addition, the isolation member 35 is positioned at the first side 28 of the coupling assembly 24, with the resonator plate 22 extending through its central aperture 37. In a preferred embodiment, the diaphragm 26 and impedance matching member 32 are bonded to the resonator plate 22 such that the inner surface 33 of the impedance matching member 32 is bonded to the front edge 56 of the resonator plate 22. In addition, bonding will also typically occur between the other surfaces of the resonator plate 22, i.e., inner and outer surfaces 52 and 54 and side edges 60, 62, the surfaces 36, 38, 59, 64 and 66 on the peninsula portion 50, and the surface of the diaphragm 26 adjacent the aperture 30. In other words, all adjacent surfaces of the diaphragm 26, the resonator plate 22 and the peninsula portion 50 may be joined by the bonding. Typically, the bonding may be accomplished via an epoxy bond 80 applied at the end of the resonator plate 22 forming a mechanical connection between the resonator plate 22 and the diaphragm 26 and impedance matching member 32 components of the coupling assembly 24, as well as to adhere the isolation member 35 to the first side 28 of the coupling assembly 24. The epoxy bond 80 additionally affixes the coupling assembly 24 to the peninsula portion 50 of the substrate member 20, such that the coupling assembly 24 is supported from the substrate member 20 with the first side 28 of the coupling assembly 24 adjacent to and spaced from the front edge 46 of the substrate member 20.

Accordingly, transmission of ultrasonic energy between the resonator plate 22 and the coupling assembly 24 is facilitated by the mechanical connection formed by the epoxy bond 80. Through the coupling to the resonator plate 22, the coupling assembly 24 exhibits good transmittance and impedance matching to the medium at the operating frequencies of the resonator plate 22, which in the presently described embodiment may be in the range of approximately 100 kHz to approximately 1 MHz.

An advantage of the construction of the transducer assembly 16 described herein relates to the construction of the resonator plate 22 and its assembly to the substrate member 20. Specifically, the geometric configuration of the resonator plate 22 is such that a plurality of the resonator plates 22 may be obtained from a single sheet of ceramic material. In particular, a sheet of ceramic material such as, for example, PZT5A may be manufactured and scored or cut to form a plurality of individual rectangular pieces substantially corresponding to the desired dimensions of the resonator plate 22. Hence, multiple resonator plates 22 may be manufactured with minimal waste or residual material, as compared to formation of prior art disk-shaped transducer resonators which necessitate more steps to form to the desired shape, as well as less efficient use of materials.

Further, as noted above, the placement of the resonator plate 22 parallel to the substrate member 20 facilitates automated assembly of the transducer assembly 16, such as by means of a conventional pick-and-place assembly operation. In contrast, known assembly operations for assembly of transducer resonators that are not mounted in parallel relation to the mounting structure, i.e., printed circuit board, often require operator handling of the ceramic resonator to effectively place the resonator relative to the mounting structure. Accordingly, a combination of efficiencies in the present transducer design contribute to an easily manufactured and economical assembly.

It should be noted that the present invention is not necessarily limited to the particular rectangular shape described herein for the resonator plate 22. Hence, other shapes may be selected for the resonator plate 22, although a resonator plate 22 having a form factor that facilitates economical manufacture of the resonator plate 22 is preferred.

Figure 5:
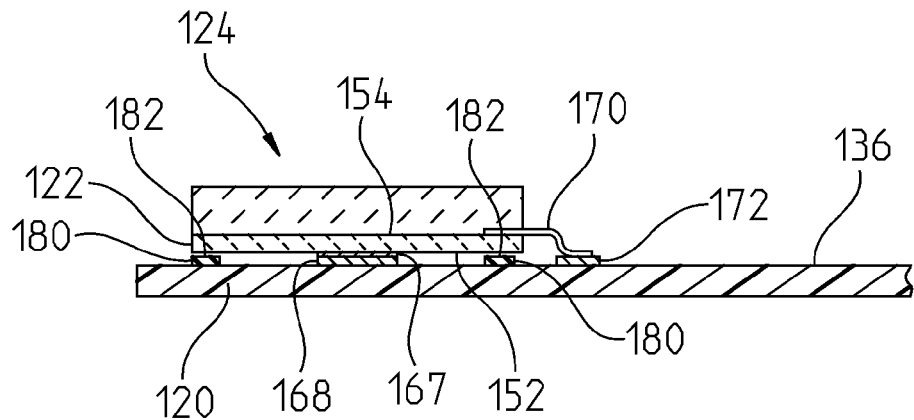
FIG. 5 is an enlarged cross-section view of the coupler end of a transducer assembly in accordance with an alternative embodiment of the present invention.
Figure 6:
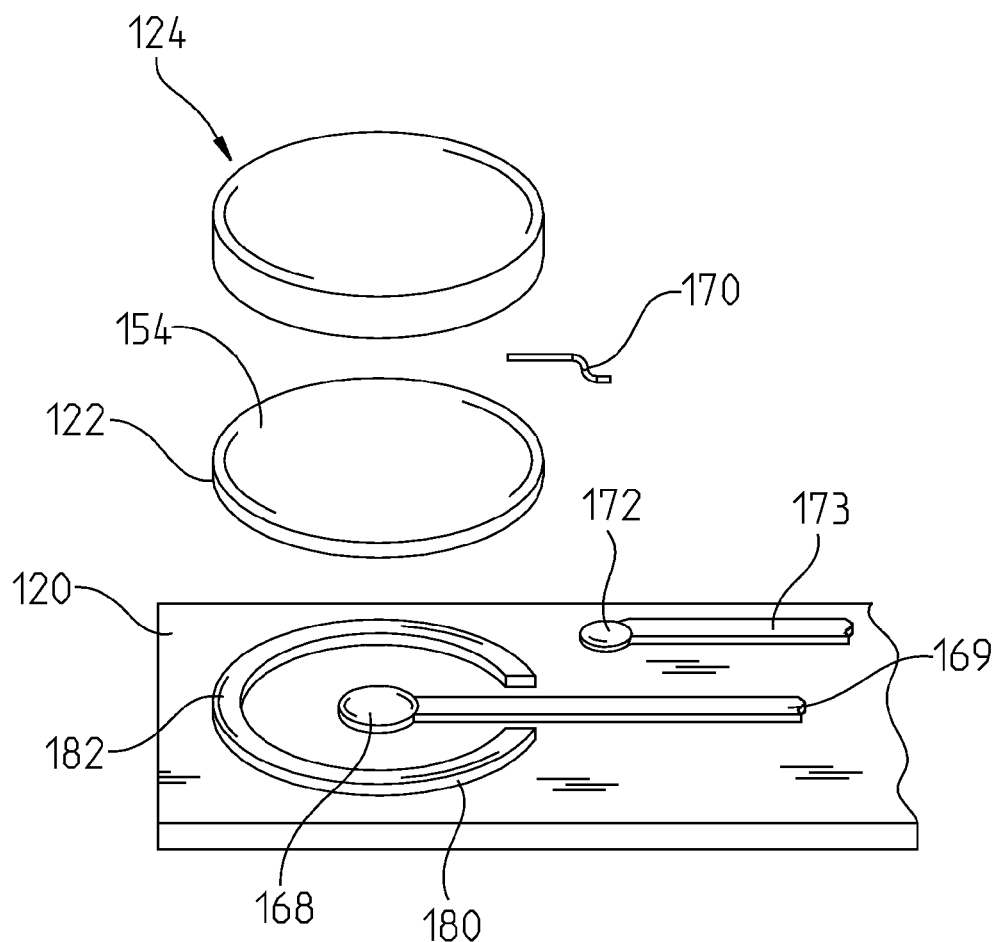
FIG. 6 is an exploded perspective view the alternative embodiment of FIG. 5.

An example of an alternative embodiment of the present invention is illustrated in FIGS. 5 and 6 in which a disk-shaped resonator plate 122 is supported on a substrate member 120 in a manner similar to that described for the embodiment illustrated in FIGS. 1-4, and in which elements of the embodiment of FIGS. 5 and 6 corresponding to the embodiment of FIGS. 1-4 are labeled with the same reference numeral increased by 100.

The resonator plate 122 preferably comprises a piezoceramic plate, similar to the material described above for the resonator plate 22. The resonator plate 122 may be supported on a first contract pad 168 such that the resonator plate 122 is supported in spaced relation to an upper planar surface 136 of the substrate member 120, with an air gap between the resonator plate 122 and the substrate member 120. Preferably, the first contact pad 168 engages the resonator plate 122 at the geometric center of the resonator plate 122 and may be attached by a solder connection 167, such as may be implemented by an SMT reflow process, to form an electrical connection between an electrode on the inner surface 152 of the resonator plate 122 and the first contact pad 168. Hence, the resonator plate 122 is supported in cantilever relation on the first contact pad 168. A second electrical connection to an electrode on the outer surface 154 of the resonator plate 122 may be provided by a top wire 170 extending to a contact pad 172 on the substrate member 120, and may be connected via an SMT reflow process.

A coupler 124 comprising, for example, a glass-filled epoxy member is located on the outer surface 154 of the resonator plate 122 to provide impedance matching between the resonator plate 122 and a medium. The coupler 124 may be provided with a recess for accommodating the top wire 170 where it is attached to the top surface 154 of the resonator plate 122. The path for acoustic signals transmitted from and received by the resonator plate 122 and coupler 124 extends in a direction that is generally orthogonal to the planar surface 136 of the substrate member 120. It may be noted that in the present embodiment, the coupler 124 is constructed without a diaphragm in that the resonator plate 122 substantially distributes the vibrational energy across the entire area of the coupler 124, without requiring a diaphragm to distribute the energy in the radial direction.

In addition, a support or support ring 180 may be located on the substrate member 120 substantially aligned with at least a portion of an outer peripheral portion of the inner surface 152 of the resonator plate 122. The support ring 180 extends above the plane of the planar surface 136, and includes an upper surface 182 that is preferably spaced a relatively small distance from the inner surface 152 of the resonator plate 122. The support ring 180 may be engaged by the inner surface 152 to limit the cantilever forces that may be exerted at the mounting point with the first contact pad 168.

Figure 7:
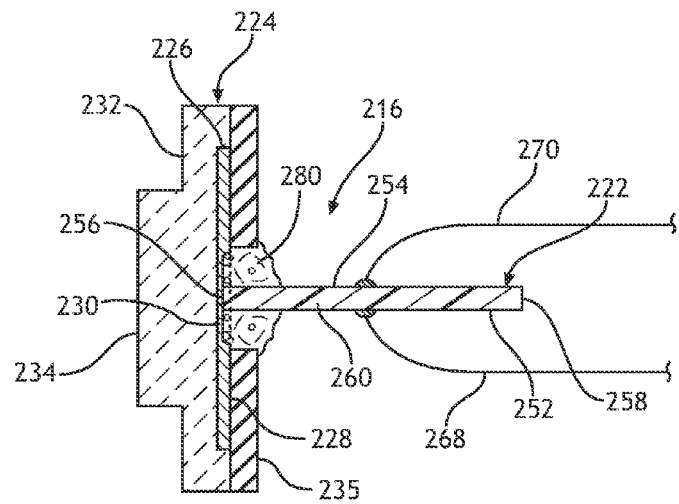
FIG. 7 is an enlarged cross-sectional view of a transducer assembly in accordance with a further alternative embodiment of the invention.
Figure 8:
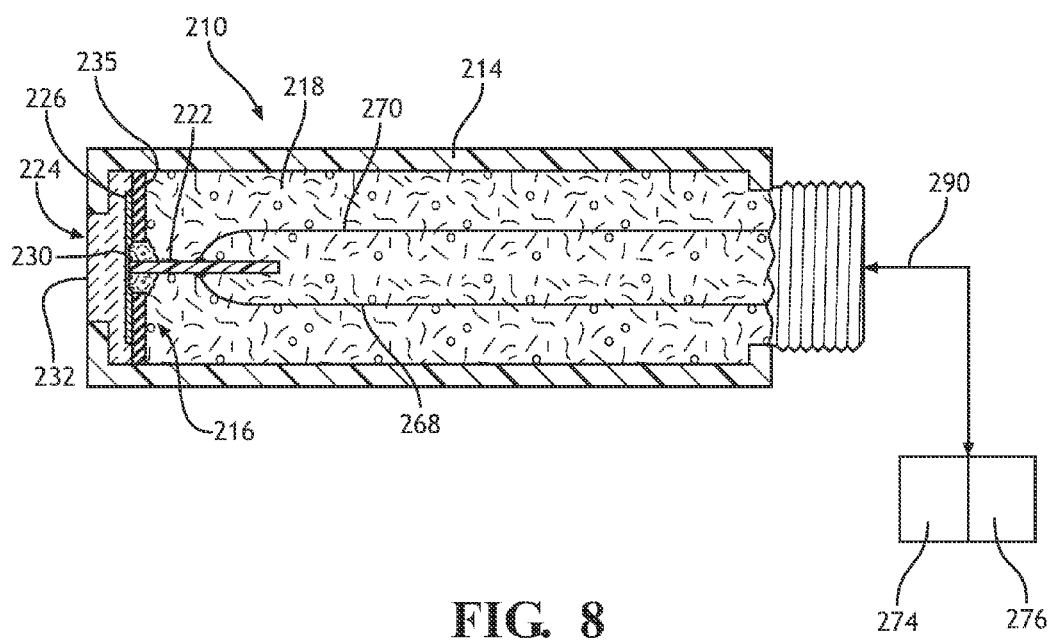
FIG. 8 is a side elevation view in partial cross-section of a sensor system incorporating the transducer assembly of FIG. 7.

An example of a further alternative embodiment of the present invention is illustrated in FIGS. 7 and 8 in which a transducer assembly 216 may be provided, and in which elements of the embodiment of FIGS. 7 and 8 corresponding to the embodiment of FIGS. 1-4 are labeled with the same reference numeral increased by 200.

The transducer assembly 216 illustrated in FIGS. 7 and 8 is similar to the transducer assembly 16 described with reference to FIGS. 1-4, but is constructed without a substrate member supporting a resonator plate 222. In particular, the resonator plate 222 is supported in cantilever relation from a coupler 224. The resonator plate 222 preferably comprises a piezoceramic plate, similar to the material described above for the resonator plate 22. Further, the resonator plate 222 may comprise an elongated rectangular element, similar to the previously described resonator plate 22, and including opposing planar surfaces 252, 254, a front edge 256, a rear edge 258 and opposing side edges (only side edge 260 shown). The resonator plate 222 includes a major dimension and a minor dimension as defined for the resonator plate 22, see major and minor dimensions $D_1$ and $D_2$ in FIG. 4.

The coupler 224 may comprise an assembly including a diaphragm 226 and an impedance matching member 232. In addition, the coupler 224 may include an isolation member 235. The coupler 224, including the diaphragm 226, impedance matching member 232 and isolation member 235 may comprise the same materials and be constructed the same as is described above for the coupling assembly 24. In particular, the coupler 224 includes a first side 228 defined by the diaphragm 226, and a second side 234 defined by the impedance matching member 232. The diaphragm 226 includes a center portion 230 having a reduced thickness relative to a surrounding portion of the diaphragm 226. An end of the resonator plate 222 extends to locate the front edge 256 adjacent to the center portion 230, with the first side 228 of the coupler 224 extending transverse, i.e., perpendicular, to the resonator plate 222.

A bonding structure comprising, for example, an epoxy bond 280 mechanically connects the outer surfaces of the resonator plate 222 adjacent the front edge 256 to the diaphragm 226, as well as to adhere the isolation member 235 to the first side 228 of the coupler 224. The bond 280 supports the resonator plate 222 to the coupler 224, extending in cantilever relation from the coupler 224. That is, in contrast to the embodiment of FIGS. 1-4, an end of the major dimension of the resonator plate 222 adjacent the front edge 256 is supported at the coupler 224 and may be substantially unsupported by other structure.

Electrical contacts, i.e., wires 268, 270, may be connected to the opposing planar surfaces 252, 254 of the resonator plate 222 at locations that are approximately midway between the opposing ends 256, 258. The wires 268, 270 provide electrical connections for conveying power to and transmitting signals from the resonator plate 222. It should be noted that although the wires 268, 270 are shown connected approximately midway along the major axis of the resonator plate 222, the particular location for the wires 268, 270 may vary. For example, the contact location between the wires 268, 270 and the resonator plate 222 may be fine tuned to provide a particular frequency response for transmitting and receiving signals.

Referring to FIG. 8, the transducer assembly 216 may be located in a housing 214 to provide a sensor assembly or sensor 210 similar to that described for the sensor 10. In particular, the sensor 210 may include a damping material 218, such as a urethane material, surrounding the transducer assembly 216. The damping material 218 may be provided to damp the coupler 224 and the resonator plate 222 to lower the Q value. The damping may be controlled to provide a desired Q value by controlling the amount of contact between the damping material 218 and the coupler 224 and/or the resonator plate 222. For example, the isolation member 235, which isolates the diaphragm 226 and at least a portion of the impedance matching member 232 from the damping material 218, may be reduced in size to permit or increase contact between the damping material 218 at one or both of the diaphragm 226 and the impedance matching material 232.

The wires 268, 270 provide electrical connections between the resonator plate 222 and a power supply 274 and processor 276, located outside of the housing 214, via a connection represented by line 290. Alternatively, the wires 268, 270 may extend to a power supply and processor (not shown) located inside the housing 214. The power supply 274 and processor 276 are configured to provide electrical power to the resonator plate 222 via the wires 268, 270 to produce a predetermined frequency signal at the coupler 224, and to receive and process a return signal received at the coupler 224 for determining the distance between an object and the sensor 210.

An advantage of the transducer assembly 216 described herein relates to the support of the resonator plate 222 to the coupler 224 being cantilevered, such that a constraint on the vibrational mode of the resonator plate 222 is removed as compared to the transducer assembly 16 of FIGS. 1-4. Although vibrational signals at different frequencies may be produced in different directions within the resonator plate 222, the dominant frequency of the resonator plate 222 will be in the direction of the major dimension. It is believed that providing the cantilever support for the resonator plate 222 provides a design in which less material may be required to achieve a desired power output of the sensor 210.

Further, the lack of a constraint along the major dimension permits the transducer assembly 216 to be scaled up or down without a substantial redesign of the assembly 216. Also, elimination of a connection between the resonator plate 222 and a substrate, such as is provided in the embodiment of FIGS. 1-4, may reduce the fragility of the transducer assembly 216 as a result of fewer connections or constraints being placed on the resonator plate 222.

It may be noted that in an alternative configuration of the present embodiment, the diaphragm 226 may be formed with an aperture in the location of the center portion 230. In this configuration, the attachment of the resonator plate 222 to the coupler 224 may comprise locating the front edge 256 of the resonator plate through the aperture in the diaphragm 226 and adjacent to the impedance matching member 232, in a manner similar to that described for the embodiment of FIGS. 1-4.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. An ultrasonic transducer assembly for use in sensing the location of objects in proximity to the transducer, said ultrasonic transducer assembly comprising:
   a piezoceramic resonator plate comprising an elongated member including a major dimension and a minor dimension; and
   a coupler connected to a surface of said resonator plate adjacent an end of said major dimension for acoustically coupling said resonator plate to a medium in contact with said coupler; and
   said coupler comprising a substantially rigid plate-like diaphragm member extending transverse to said resonator plate.

2. The ultrasonic transducer assembly of claim 1, wherein said resonator plate comprises a rectangular plate.

3. The ultrasonic transducer assembly of claim 1, wherein said coupler further comprises an impedance matching member extending over said diaphragm member.

4. The ultrasonic transducer assembly of claim 3, wherein said diaphragm member includes a center portion having a reduced thickness relative to a surrounding portion said diaphragm member and said resonator plate extends to said center portion, and including a bonding structure mechanically connecting said surface of said resonator plate to said diaphragm member.

5. The ultrasonic transducer assembly of claim 4, wherein said diaphragm member comprises a disk-shaped member.

6. The ultrasonic transducer assembly of claim 4, including a damping material located on a side of said coupler opposite said medium, and including a resilient isolation layer separating said diaphragm member from said damping material.

7. The ultrasonic transducer assembly of claim 1, including electrical conductors connected to opposite sides of said resonator plate at locations approximately midway between opposing ends of said major dimension.

8. The ultrasonic transducer assembly of claim 1, wherein said resonator plate is supported in cantilever relation extending from said coupler.

9. An ultrasonic transducer assembly for use in sensing the location of objects in proximity to the transducer, said ultrasonic transducer assembly comprising:
   a piezoceramic resonator plate including opposing planar surfaces;
   electrical contacts connected to each of said planar surfaces of said resonator plate for connecting said resonator plate to a power supply; and
   a coupler comprising a planar member including opposing first and second sides, said first side extending transverse to and connected to a surface of said resonator plate for acoustically coupling said resonator plate to a medium in contact with said second side of said coupler.

10. The ultrasonic transducer assembly of claim 9, wherein said resonator plate comprises a rectangular plate defining an elongated major dimension and a minor dimension, and said resonator plate is supported in cantilever relation on said coupler with an end of its elongated major dimension extending from said first side of said coupler.

11. The ultrasonic transducer assembly of claim 9, wherein said coupler comprises a substantially rigid disk-shaped diaphragm and an impedance matching member of a different material than said diaphragm extending over said diaphragm and defining said second side, and said coupler further includes a bonding structure mechanically connecting said surface of said resonator plate to said diaphragm at said first side.

12. The ultrasonic transducer assembly of claim 11, including a damping material surrounding said resonator plate and said coupler, and said coupler further comprises a resilient isolation layer separating said diaphragm from said damping material.

13. The ultrasonic transducer assembly of claim 10, wherein said electrical contacts are connected to said resonator plate at locations approximately midway between opposing ends of said major dimension.

14. A sensor including an ultrasonic transducer assembly for use in sensing the location of objects in proximity to the transducer, said sensor comprising:
   a rectangular piezoceramic resonator plate defining an elongated major dimension and a minor dimension, said resonator plate including opposing planar surfaces;

electrical contacts connected to each of said planar surfaces of said resonator plate for connecting said resonator plate to a power supply;

a disk-shaped coupler comprising a planar member including opposing first and second sides, said first side extending transverse to and connected to a surface of said resonator plate, wherein said resonator plate is supported in cantilever relation on said coupler with an end of its elongated major dimension extending from said first side of said coupler; and said coupler being acoustically excited by said resonator plate to transmit a signal to an object in proximity to said coupler, and said coupler receiving and transmitting reflected signals from said object to said resonator plate.

15. The sensor of claim 14, wherein said coupler comprises a substantially rigid diaphragm and an impedance matching member of a different material than said diaphragm extending over said diaphragm and defining said second side, and said coupler further includes a bonding structure mechanically connecting said surface of said resonator plate to said diaphragm at said first side.

16. The sensor of claim 15, including a housing containing a damping material surrounding said resonator plate and said coupler, and said coupler further comprises a resilient isolation layer separating said diaphragm from said damping material.

* * * * *